(12) United States Patent
Kumar et al.

(10) Patent No.: US 7,737,561 B2
(45) Date of Patent: *Jun. 15, 2010

(54) DUAL DAMASCENE INTEGRATION OF ULTRA LOW DIELECTRIC CONSTANT POROUS MATERIALS

(75) Inventors: Kaushik A Kumar, Beacon, NY (US); Kelly Malone, Poughkeepsie, NY (US); Christy S Tyberg, Mahopac, NY (US)

(73) Assignee: International Business Machines Corporation, Armonk, NY (US)

(*) Notice: Subject to any disclaimer, the term of this patent is extended or adjusted under 35 U.S.C. 154(b) by 2 days.

This patent is subject to a terminal disclaimer.

(21) Appl. No.: 11/968,929

(22) Filed: Jan. 3, 2008

(65) Prior Publication Data

US 2008/0099923 A1 May 1, 2008

Related U.S. Application Data

(60) Continuation of application No. 11/341,338, filed on Jan. 26, 2006, now Pat. No. 7,338,895, which is a division of application No. 10/645,308, filed on Aug. 21, 2003, now Pat. No. 7,057,287.

(51) Int. Cl.
*H01L 23/48* (2006.01)
*H01L 23/52* (2006.01)
*H01L 29/40* (2006.01)

(52) U.S. Cl. ............... 257/774; 257/759; 257/E21.579; 257/E23.167

(58) Field of Classification Search ................. 257/774, 257/759, E21.579, E23.167
See application file for complete search history.

(56) References Cited

U.S. PATENT DOCUMENTS

| | | | |
|---|---|---|---|
| 6,358,842 B1 * | 3/2002 | Zhou et al. | 438/633 |
| 6,383,920 B1 | 5/2002 | Wang et al. | 438/639 |
| 6,710,450 B2 | 3/2004 | Gates et al. | 257/759 |
| 6,716,742 B2 | 4/2004 | Gates et al. | 438/623 |
| 6,723,635 B1 | 4/2004 | Ngo et al. | 438/627 |
| 6,797,605 B2 | 9/2004 | Goh et al. | 438/622 |
| 7,057,287 B2 * | 6/2006 | Kumar et al. | 257/758 |

OTHER PUBLICATIONS

Wolf, S. et al., *Silicon Processing for the VLSI Era*, vol. 1: Process Technology, 1986, Lattic Press, p. 171-2.

* cited by examiner

*Primary Examiner*—Howard Weiss
(74) *Attorney, Agent, or Firm*—Ohlandt, Greeley, Ruggiero & Perle, L.L.P.; Daniel P. Morris, Esq.

(57) ABSTRACT

A dual damascene interconnect structure having a patterned multilayer of spun-on dielectrics on a substrate is provided. The structure includes: a patterned multilayer of spun-on dielectrics on a substrate, including: a cap layer; a first non-porous via level low-k dielectric layer having thereon metal via conductors with a bottom portion and sidewalls; an etch stop layer; a first porous line level low-k dielectric layer having thereon metal line conductors with a bottom portion and sidewalls; a polish stop layer over the first porous line level low-k dielectric; a second thin non-porous via level low-k dielectric layer for coating and planarizing the line and via sidewalls; and a liner material between the metal via and line conductors and the dielectric layers. Also provided is a method of forming the dual damascene interconnect structure.

25 Claims, 4 Drawing Sheets

DUAL DAMASCENE INTEGRATION OF ULTRA LOW DIELECTRIC CONSTANT POROUS MATERIALS

CROSS REFERENCE TO RELATED APPLICATIONS

This application is a continuation of U.S. application Ser. No. 11/341,338 filed Jan. 26, 2006, now U.S. Pat. No. 7,338,895, which is a divisional of U.S. application Ser. No. 10/645,308 filed Aug. 21, 2003, now U.S. Pat. No. 7,057,287.

BACKGROUND OF THE INVENTION

1. Field of the Invention

The present invention relates to interconnect structures and a method of making them. More particularly, the present invention relates to a dual damascene interconnect structure having a thin non-porous low-k dielectric layer and a liner material between the metal via and line conductors and the dielectric layers. The interconnect structures are suitable for use in high-speed microprocessors, application specific integrated circuits (ASIC's) and other high speed integrated circuits (IC's).

2. Description of the Prior Art

Many low-k dielectric plus Cu interconnect structures of the dual damascene type are known. For an example of the dual damascene process wherein SiLK™ can be used as a low-k dielectric material, reference is made to U.S. Pat. No. 6,383,920, which is assigned to the same assignee as the present invention, the contents of which are incorporated herein by reference in their entirety as if fully set forth. In order to achieve the necessary reduction in the RC delay in future generations of integrated circuits, porous materials must be used as the dielectric. In addition, due to the 5-20 nanometer pore sizes of porous organic materials, a buried etch stop layer is necessary to give smooth metal line bottoms. However, in conventional integration of an organic dielectric where a cap layer is deposited above the prior level of metallization before depositing the insulator materials, challenges to the dual damascene integration of porous dielectrics arise from the inability to achieve etch selectivity of low-k etch stops to both the organic dielectric and the inorganic (typically SiN or SiCN) cap layer.

An illustration of dual damascene integration with an embedded etch stop and a cap layer can be found in U.S. Pat. No. 6,448,176 B1, FIG. 1. The lack of etch selectivity between the embedded etch stop and cap does not cause poor line profiles with a dense dielectric because the lines stop on the etch stop in the dielectric etch, then go just through the etch stop and stop on the via level dielectric during the cap open RIE step. When using porous dielectrics, if the etch stop is removed at the bottom of the line a rough line bottom created from the porosity in the via level dielectric will result. Also, the line and via sidewalls can have a surface roughness equivalent to the size of the pores in the dielectric leading to defects in the liner. In addition, the choices of materials for the etch stop and cap layers necessary to achieve a low k effective, efficient raw process time and mechanical integrity of the stack are limited.

SUMMARY OF THE INVENTION

It is an object of the present invention to provide an ultra low-k dielectric plus Cu interconnect structure of the dual damascene type with precise and uniform control over the Cu conductor resistance with improved line profiles, improved liner coverage, adhesion and improved reliability.

It is an object of the present invention to provide a porous line level dielectric and a non-porous via-level dielectric with improved RIE profiles, improved liner coverage, excellent adhesion and improved reliability.

It is another object of the present invention to provide sidewall planarizing layer coating the sides of the lines of the porous dielectric.

It is another object of the present invention to provide a method to make the inventive structure.

The present invention provides a dual damascene interconnect structure, including:

a patterned multilayer of dielectrics on a substrate, including:

a cap layer;

a first non-porous via level low-k dielectric layer having thereon metal via conductors with a bottom portion and sidewalls;

an etch stop layer;

a first porous low-k line level dielectric layer having thereon metal line conductors with a bottom portion and sidewalls;

a polish stop layer over the first porous low-k dielectric;

a second thin non-porous low-k dielectric layer for coating and planarizing the line and via sidewalls; and a liner material between the metal via and line conductors and the dielectric layers.

The present invention provides a method of forming a dual damascene interconnect structure, including the steps of:

(a) forming a multilayer of dielectrics on a surface of a substrate, including: a cap layer; a first non-porous low-k dielectric layer; an etch stop or etch smoothing layer; a first porous low-k dielectric layer; and a CMP polish stop layer;

(b) producing a multilayer of dielectrics having thereon line and via profiles having a bottom portion and sidewalls;

(c) applying a second thin, non-porous low-k dielectric layer on the bottom portion and sidewalls of the line and via profiles;

(d) selectively removing the thin, non-porous dielectric layer from the bottom portion of the vias and lines; and (e) depositing a conductive liner on the bottom portion of the vias and lines; and (f) depositing a conductive metal in the line and via profiles to produce the interconnect structure.

The present invention provides interconnect structures for high-speed microprocessors, application specific integrated circuits (ASICs) and other high speed IC's. The invention provides ultra low dielectric constant (low-k) interconnect structures having enhanced circuit speed, precise values of conductor resistance, improved manufacturability and reliability and improved mechanical integrity.

Further, the present invention employs a smooth, continuous, defect free conductive liner layer on the bottoms and sidewalls of the vias and lines in a porous dielectric, which prevents the dielectric material from ever coming into contact with the conducting metal thereby preventing device failure.

The present invention provides many additional advantages, which shall become apparent from the description below.

DETAILED DESCRIPTION OF THE INVENTION

Figure 1A:
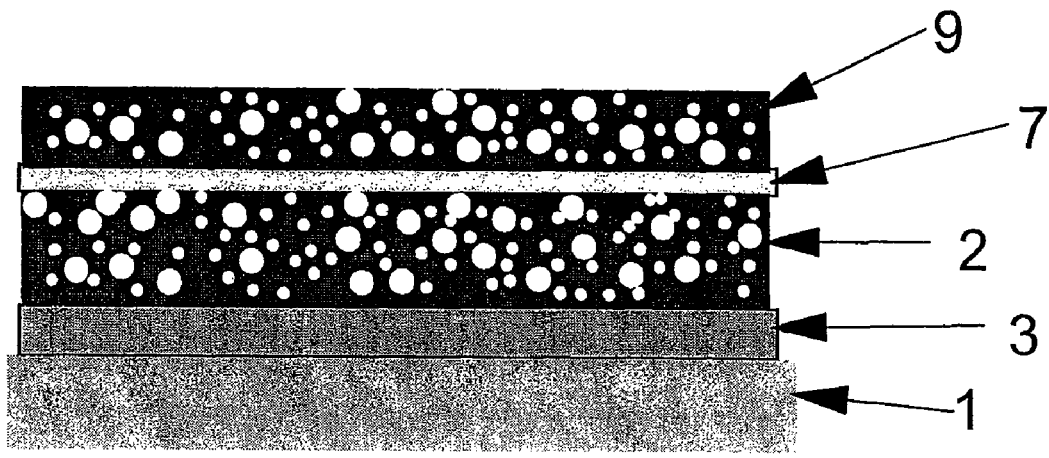
FIGS. 1a and 1b are schematic drawings of a prior art porous dielectric with a buried etch stop before and after RIE and metallization respectively.

The patterned multilayer of dielectrics on a substrate includes a cap layer, a first spin-on organic non-porous dielectric layer, a spin-on low-k Silicon containing etch stop disposed on the first spin-on non-porous organic dielectric and a first spin-on porous dielectric of similar atomic composition to the first spin-on non-porous organic dielectric disposed upon the etch stop; where the spin-on embedded etch stop is covalently bonded to both the first non-porous and first porous dielectric layers.

The first non-porous dielectric layer is comprised of SiLK™, GX-3™, or other low k dielectric. Materials of this kind are described in U.S. Pat. No. 5,965,679 entitled "Polyphenylene Oligomers and Polymers" by James P. Godschalx et al., which is assigned to The Dow Chemical Company, contents of which are incorporated herein by reference in their entirety as if fully set forth. Preferably, the first porous dielectric layer is comprised of porous SiLK™, GX_$3_p$™, or other porous low k dielectric materials with pore structure leading to a rough etch front and/or rough line and via sidewalls due to the size or distribution of porosity.

Materials of this kind are described in Patent Cooperation Treaty International Patent Application WO 00/31183 entitled "A composition containing a crosslinkable matrix precursor and a porogen and a porous matrix prepared therefrom" by Kenneth, J. Bruza et al., which is assigned to The Dow Chemical Company, the contents of which are incorporated herein by reference in their entirety as if fully set forth.

Preferably, the etch stop layer is comprised of HOSp™, HOSP BESt™, AP 6000™, Ensemble™ Etch Stop, Ensemble™ Hard Mask, organo silsesquioxanes, hydrido silsesquioxanes, hydrido-organo silsesquioxanes, siloxanes, silsesquioxanes, silicon carbides, or other spin-on material with etch selectivity to the first non porous and first porous dielectrics which will covalently bond to both the first non porous and first porous low-k dielectrics. Materials of this kind are described in U.S. Pat. No. 6,218,020 entitled "Dielectric films from Organohydridosiloxane Resins with High Organic Content" by Nigel P. Hacker et al., which is assigned to AlliedSignalInc., U.S. Pat. No. 6,177,199 entitled "Dielectric films from Organohydridosiloxane Resins with Low Organic Content" by Nigel P. Hacker et al., which is assigned to AlliedSignalInc. and International Application published under the patent cooperation treaty (PCT) publication number WO 02/083327 A1 entitled "Layered Stacks and Methods of Production Thereof" by Michael Thomas et al., which is assigned to Honeywell International Inc., the contents of which are incorporated herein by reference in its entirety as if fully set forth.

The structure can also include a second non porous ultra-thin dielectric layer applied after the dual damascene reactive ion etch process in order to planarize the surface of the sidewalls. This layer would be removed at the bottom of the lines and via spaces by a short reactive ion etching process or other process and remain only on the sidewalls to smooth the surface. The second non porous ultra-thin dielectric layer can be comprised of a spin-on or CVD deposited material. The ultra thin layer can also covalently bond to the dielectric layers.

The structure can also include a conducting liner deposited in the via and line profiles which is coated over the ultra-thin dielectric layer. The via and line profiles can also contain a conducting metal deposited after the conducting liner.

In a preferred embodiment, the structure can include a plurality of patterned metal conductors formed within the dielectric layers on the substrate, the dielectric layers including at least the first non-porous dielectric layer, the embedded etch stop or etch smoothing layer, the first porous dielectric layer, and the second non-porous thin dielectric layer coating at least the sidewalls of via and line profiles. At least one of the patterned metal conductors, located in the first non-porous dielectric layer, is an electrical via. At least one of the patterned metal conductors, located in the first porous dielectric layer, is a line connected to the via. The structure includes a top hard mask or polish stop layer disposed upon the top porous dielectric layer. Additionally the structure can include a bottom cap layer below the first dielectric layer with or without an adhesion promoter between the Cap layer and the first dielectric layer. The metal conductors are comprised of a conducting liner material which is in contact with the dielectric layers and a conducting metal fill material within the line and via profiles which does not contact the dielectric materials.

Preferably, the first spin-on non-porous dielectric layer is comprised of SiLK™, GX_3™, or other non-porous low k dielectric materials. The etch stop layer is comprised of HOSp™, HOSP BESt™, Ensemble™ Etch Stop, Ensemble™ Hard Mask, organo silsesquioxanes, hydrido silsesquioxanes, hydrido-organo silsesquioxanes, siloxanes, silsesquioxanes, silicon carbides or other spin-on material with etch selectivity to the first non porous and first porous dielectrics, which will covalently bond to both the first non porous dielectric layer and the first porous low-k dielectric layer. Preferably, the first spin-on porous dielectric layer is comprised of porous SiLK™, GX-3p™ or other porous low k dielectric materials.

The present invention also includes a metal wiring plus porous low dielectric constant (low-k) interconnect structure of the dual damascene type with a spin-on buried RIE stop having improved line profiles. This aspect of the structure of the present invention is comprised of: (A) a multilayer structure of all spin-on dielectric materials, which are applied sequentially in a single tool and then cured in a single furnace cure step, (B) a plurality of patterned metal conductors within the dielectric multilayer structure and (C) a thin non-porous dielectric layer planarizing the sidewalls of the line profiles. The improved line profiles are obtained by implementing a non-porous dielectric of similar atomic structure to the porous dielectric below the etch stop as the via level dielectric and incorporating the thin sidewall planarizing dielectric layer between the metal lines and the porous dielectric.

The structure of the invention has improved line profiles and manufacturability over conventional spin-on porous organic dielectric structures as a result of the rough etch front being smoothed by the etch stop then etching into a non-porous organic dielectric, which will not create rough line bottoms. The structure also includes a side-wall planarizing layer to smooth the sidewall profiles. The structure of the present invention is unique in that it enables the enhanced performance of an ultra-low k dielectric while maintaining the manufacturability and smooth line profiles of a non-porous dielectric. The structure is also unique in that all three dielectric layers can be sequentially applied in a single tool and the three layers will covalently bond across the interfaces leading to excellent adhesion. In addition, the thickness of the etch stop layer (or etch planarizing layer) can be minimized since it only needs to smooth the etch front and act as an etch marker and not actually stop the etch. This structure including the ultra-thin sidewall line level planarization layer should also enable the use of dielectric materials with extremely low dielectric constants and larger pore sizes or pore interconnectivity that could not be integrated with conventional integration techniques.

Structure in Accordance with the Invention

Figure 1B:
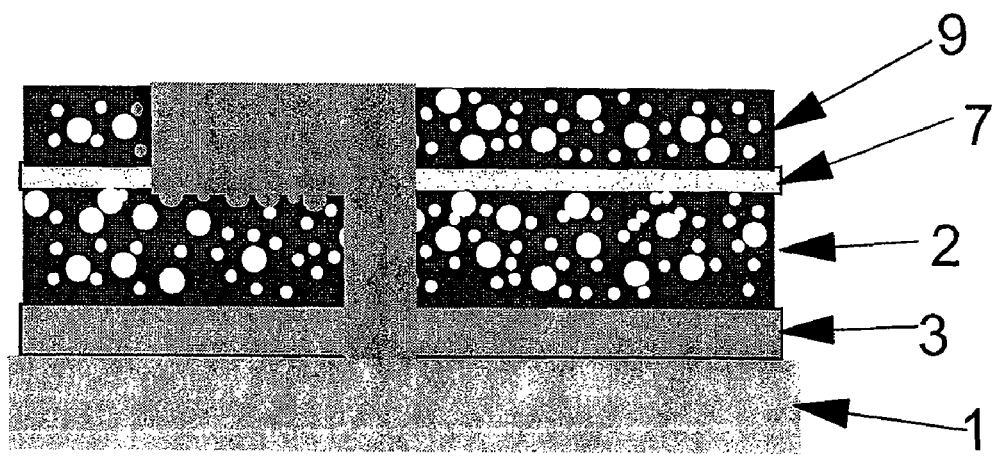

Referring to FIG. 1a and FIG. 1b (prior art description), a silicon substrate 1 has thereon a cap layer 3, a first porous low k dielectric layer 2, an etch stop layer 7 and a second porous low k dielectric layer 9. Reactive ion etch will produce a rough etch front due to the size and distribution of the porosity. Although the etch stop can smooth the etch front temporarily, during the final etch step necessary to open the cap layer 3 the etch will remove the remainder of the etch stop and leave a rough etch surface at the line bottom due to the porosity of the line level.

Referring to FIG. 2a through FIG. 2e, structures resulting from the steps of the method for making a dual damascene interconnect structure are illustrated.

Figure 2A:
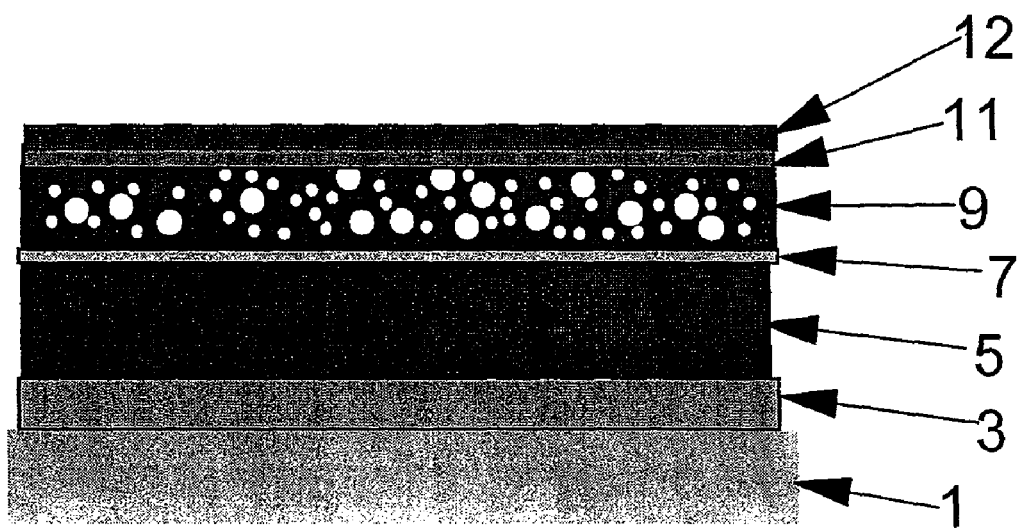
FIGS. 2a through 2e are schematic drawings of the inventive structure, which includes a pore sealing/sidewall planarization layer.

FIG. 2a shows a multilayer of dielectrics on a surface of a substrate, including a cap layer; a first non-porous low-k dielectric layer; an etch stop or etch smoothing layer; a porous low-k dielectric layer; and a CMP polish stop layer.

Figure 2B:
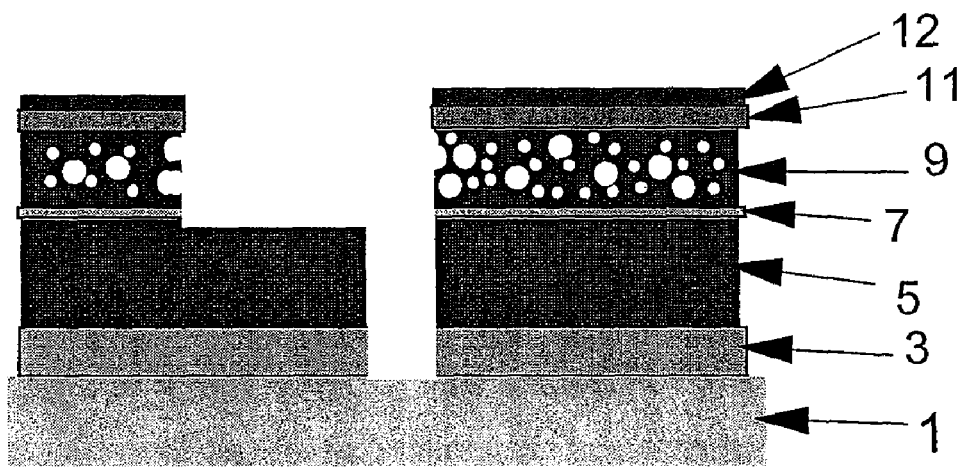

FIG. 2b shows a multilayer of dielectrics having thereon line and via profiles having a bottom portion and sidewalls.

Figure 2C:
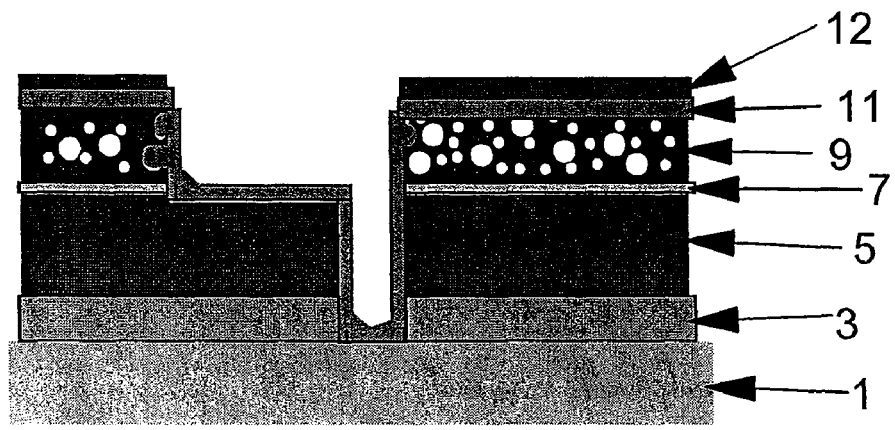

FIG. 2c shows a second thin, non-porous low-k dielectric layer 15 on the bottom portion and sidewalls of the line and via profiles.

Figure 2D:
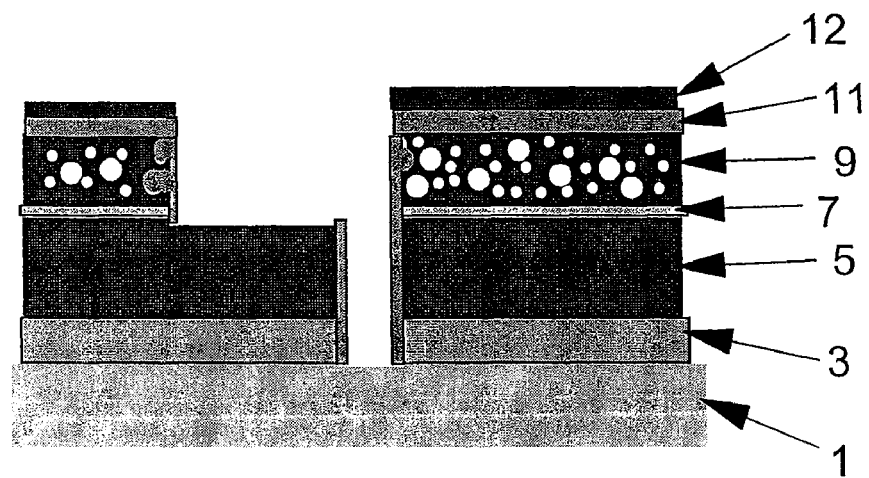

FIG. 2d shows a structure wherein the thin, non-porous dielectric layer is selectively removed from the bottom portion of the vias and lines.

Figure 2E:
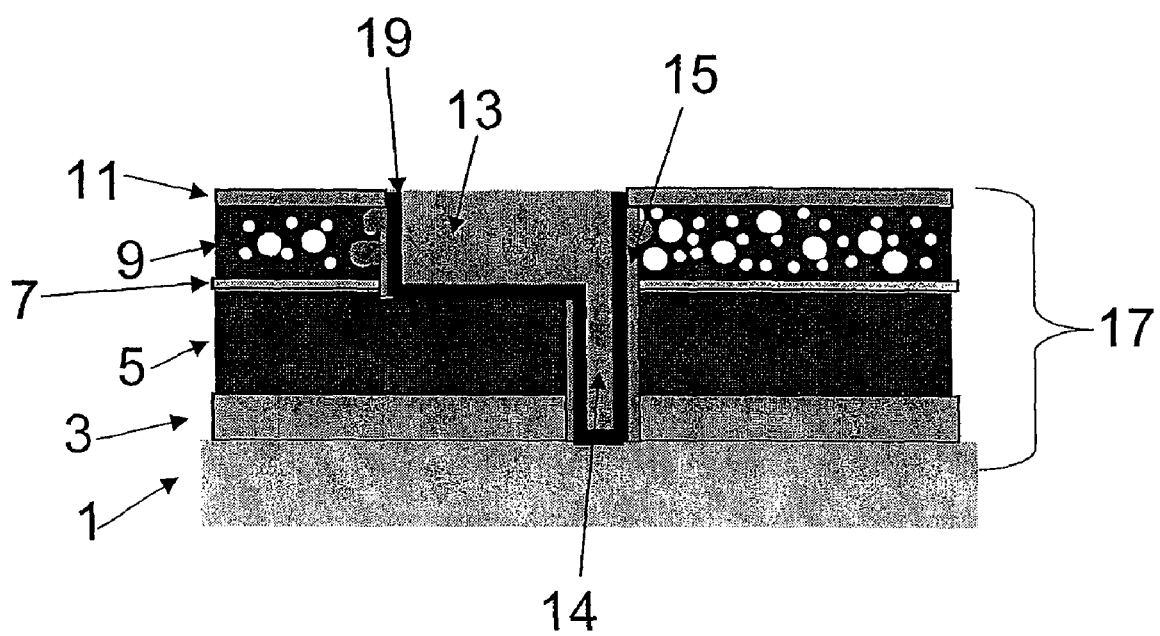

FIG. 2e shows an interconnect structure 17 in accordance with the invention wherein a metal liner 19 and a conductive metal 13 and 14 is deposited in the line and via profiles to produce interconnect structure 17. In FIG. 2e, a thin non-porous dielectric layer 15 coating the sidewalls of the line openings in the porous dielectric layer can be applied after reactive ion etching has been employed to form the line and via profiles. This layer is removed at the line and via bottoms with a second reactive ion etching step.

Referring to FIG. 2e, substrate 1 can contain electronic devices such as, for example, transistors and an array of conductor elements. An interconnect structure 17, in accordance with the invention is formed on substrate 1. Structure 17 is comprised of a cap layer 3 a first non-porous dielectric layer 5, an etch stop layer 7, a first porous dielectric layer 9, a hardmask/CMP polish stop layer 11, a second thin non-porous dielectric layer coating sidewalls of via and line profiles 15, a conducting liner 19, patterned conducting metal vias 14, and patterned conducting metal lines 13. The patterned metal lines 13 and vias 14 can be formed by a dual damascene process.

The first non-porous dielectric layer 5 can have a thickness of 600-5000 Å and a low dielectric constant of 2.6-3.2. The thickness can be selected within this broad range in accordance with the ground rules being implemented. Suitable materials for the first non porous dielectric 5 include spin-on dielectric material, such as, SiLK™, a trademark of The Dow Chemical Company, representing a class of polymer-based low-k dielectric materials including a b-staged polymer (see, for example, http://www.dow.com/silk/feature.htm and U.S. Pat. No. 6,383,920); GX-3™ (a trademark of Honeywell Electronic Materials, which is described in the web site http://www.electronicmaterials.com/na/products_services/thin_films/dielectrics/low_k_dielectrics.html), spin-on $Si_wC_xO_yH_z$ material, spin-on dielectric material, or low k spin-on dielectric material. The etch stop layer 7 can have a of thickness 50-600 Å (more preferably 50-300 Å) and an atomic composition that gives etch selectivity of at least 10:1 to the porous dielectric 9. This material has good adhesion to the first non-porous and first porous dielectric and thermal stability to a temperature of greater than 425° C. and a low dielectric constant of 3.2 or less. Suitable materials for the etch stop layer 5 include HOSp™, HOSP BESt™, AP 6000™, Ensemble™ Etch Stop, Ensemble™ Hard Mask, organa silsesquioxanes, hydrido silsesquioxanes, hydrido-organo silsesquioxanes, siloxanes, silsesquioxanes, silicon carbides, or other spin-on material with etch selectivity to the first and second dielectrics which will covalently bond to both the first and second low-k dielectrics.

The first porous dielectric layer 9 can have a of thickness of 600-5000 Å with a low dielectric constant of <2.4. Suitable materials for the first porous dielectric 9 include spin-on porous dielectric materials such as porous SiLK™ (a trademark of The Dow Chemical Company), GX_3$_p$™ (a trademark of Honeywell Electronic Materials); JSR LKD 5109™ spin-on low k dielectric material containing Si, C, O, and H (a trademark of JSR Micro Corp.); porous spin-on $Si_wC_xO_yH_z$ material, or porous low k spin-on dielectric material.

The second thin non-porous dielectric layer 15 can have a thickness of 10-100 Å and an atomic composition that can covalently bond with the first non porous and first porous dielectric layers. The second non porous ultra-thin dielectric layer can be comprised of a spin-on or CVD deposited material. Suitable materials include any material used for the first non porous dielectric or the etch stop layer, or any non-porous CVD deposited or spin-on low k dielectric material that can covalently bond with the other dielectric layers.

The function of the second thin non-porous dielectric layer deposited in the via and line profiles is to prevent liner penetration into the porous dielectric and to prevent any defects (breaks or voids) in the liner due to sidewall roughness.

Additional patterning layers can be added and removed during the patterning and reactive Ion etching steps.

In the interconnect structure, patterned metal lines 13 and vias 14 are formed by a dual damascene process within the dielectric multilayer structure.

A cross sectional view of the interconnect structure is illustrated FIG. 2e after a conductive liner 19 has been deposited. Liner 19 is deposited in a conformal manner in the line and via profiles, over the second thin non-porous dielectric layer.

The function of the liner 19 is to prevent the dielectric material from ever coming into contact with the conducting metal. Thus, the dielectric material should never be exposed to the conducting metal so that failure of the device could be prevented.

Any material suitable for preventing adverse effects (e.g., pitting, spiking, diffusion) resulting from contact between a dielectric layer and a conducting metal/layer can be used in liner 19. Typically, liner 19 includes one or more metals such as Ti, TiN, Ta, TaN, W, TiW, TaSiN, WN, or any other refractory metals and their nitrides.

Liner 19 can be deposited by any suitable process, such as by sputter deposition, chemical vapor deposition (CVD), physical vapor deposition (PVD), ionized PVD (iPVD), atomic layer deposition (ALD) or any combination thereof. Liner 19 can be of any suitable thickness, but typically has a thickness about 10 Å to about 1000 Å, preferably about 25 Å to about 100 Å.

The present invention also provides a method of forming a dual damascene interconnect structure. The method includes the steps of:

forming a multilayer of dielectrics on a surface of a substrate, including: a cap layer; a first non-porous low-k dielectric layer; an etch stop or etch smoothing layer; a porous low-k dielectric layer; and a CMP polish stop layer;

producing a multilayer of dielectrics having thereon line and via profiles having a bottom portion and sidewalls;

applying a second thin, non-porous low-k dielectric layer on the bottom portion and sidewalls of the line and via profiles;

selectively removing the thin, non-porous dielectric layer from the bottom portion of the vias and lines;

depositing a conductive liner conformally in the line and via profiles so as to cover on the bottom portion and sidewalls of the vias and lines; and depositing a conductive metal in the line and via profiles to produce the interconnect structure.

The method can further include curing the dielectric layers to render the top dielectric layer porous and promote crosslinking between the dielectric layers. The dielectric layers in the stack are preferably cured in a single step after sequential application in a single tool. The dielectric application tool can be a spin coating tool containing high temperature hot plate baking chambers and the curing step can be a furnace curing step conducted at a temperature of from about 300° C. to about 500° C. for about 15 minutes to about 3 hours.

The method can further include forming a plurality of patterned metal conductors within the dielectric stack on the substrate. Additional dielectric layers can be added and the structure is completed by adding conductors.

The preparation of a dual damascene interconnect structure according to the method of the present invention is further described in a stepwise manner herein below:

(1) Applying the cap layer by PECVD deposition;
(2) Spin-applying the via level dielectric (non-porous low k dielectric);
(3) Hot plate baking the dielectric layer to crosslink (310° C. for 2 min and 400° C. for 2 min);
(4) Spin-applying the etch stop layer;
(5) Hot plate baking the etch stop layer to crosslink (310° C. for 2 min)
(6) Spin-applying the line level porous dielectric;
(7) Hot plate baking porous dielectric (250° C. for 2 min);
(8) Curing the dielectric layers in a furnace in a single step (415° C. for 90 min);
(9) Adding additional patterning layers;
(10) Carrying out the lithography steps;
(11) Reactive ion etching to produce line and via profiles;
(12) Spin-applying a thin non-porous dielectric layer;
(13) Hot plate baking and curing the dielectric layer;
(14) Reactive ion etching to remove the thin non-porous dielectric layer at the bottom of the via pattern;
(15) Depositing a conductive liner in the line and via profiles; and
(16) Depositing a conductive metal in the line and via profiles.

General Method for Fabricating Structures of the Invention

Steps in the General Method

A. Stack of Dielectric Layers Applied

The dielectric layers 5, 7, and 9 of the inventive interconnect 17 structure are applied to the substrate 1, by spin on techniques following the chemical vapor deposition of the cap layer 3. The first dielectric layer 5 in the structure is preferably a non-porous low k dielectric with a desired thickness of 600-5000 Å. This low k dielectric is applied by a spin-on technique with a spin speed of 1000-4000 rpm. After spinning the low k dielectric is hot plate baked to dry the solvent and render the film insoluble at 200-400° C. for 1-2 minutes. This time and temperature is sufficient to render the film insoluble. After cooling, the buried etch stop layer 7, with a desired thickness of approximately 50-600 Å, is applied by a spin-on technique with a spin speed of 1000-4000 rpm. The etch stop layer is hot plate baked to dry the solvent and render the film insoluble at 200-400° C. for 1-2 minutes. This time promotes sufficient crosslinking to render the film insoluble. After cooling, the top porogen-containing dielectric layer 9 is applied in a similar fashion. Layer 9 can be of the same composition as layer 5, but with a slightly higher thickness and an additional thermally-labile component capable of producing pores when removed. The desired thickness of the top low k dielectric layer 9 is approximately 600-5000 Å. This layer is spun at 1000-4000 rpm, then hot plate baked at approximately 100-400° C. for approximately 30-120 seconds to partially dry the solvent.

B. Stack of Dielectric Layers Cured in a Single Cure Step

At this point, the wafer is placed in a furnace in an atmosphere of pure $N_2$ at extremely low $[O_2]$ and $[H_2O]$ and cured at approximately 300-450° C. for approximately 15 minutes to 3 hours to crosslink the stack and burn out the sacrificial porogen.

Additional dielectric layers are added for dual damascene patterning (distributed hard mask) and Reactive Ion Etching is performed to form the line (trench) and via profiles. As noted above, the dual damascene process described in, for example, U.S. Pat. No. 6,537,908 B2 can be used when adding additional layers and forming the line and via.

The thin non-porous dielectric layer 15 is applied to coat the sidewalls of the line and via. This layer can be applied by CVD deposition, by spin-coating, or by other methods. A cure step can also be included to crosslink the thin nonporous layer and promote covalent bonding with dielectric layers 5 and 9.

A second RIE step is added to remove the thin dielectric layer at the bottom of the trench and via and leave the layer only on the sidewalls of the line and via.

The dual damascene structure is completed by standard dual damascene BEOI processing, which includes filling the line (trench) and via profiles with at least a metal liner and a conductive metal; planarizing the conductive metal stopping on the hard mask/polish stop layer as described in for example U.S. Pat. No. 6,537,908 B2.

A Method for Making the Preferred Embodiment (Substrate/SiN/SilK™/HOSP BESt™/Porous SilK™)

A. Stack of Dielectric Layers Applied

The SiN cap layer is applied to the substrate by CVD deposition (layer 3, FIG. 2).

The first layer of low k dielectric SilK™ is applied to the cap layer by spin coating (layer 5, FIG. 2). After spinning, the wafer is placed on a 310° C. hot plate for 2 minutes and a 400° C. hot plate for 2 minutes. This time and temperature are sufficient to render the film insoluble.

A solution of HOSP BESt™ diluted to achieve a film thickness of 250 Å at a spin speed of 3000 rpm, is applied to the wafer and spun at 3000 rpm for 30 seconds, to produce layer 7 (FIG. 2). After spinning, the wafer is placed on a hot plate at 310° C. for 2 minutes to dry and partially crosslink the film. This time and temperature is sufficient to render the film insoluble.

B. The third and final layer, consisting of porous SiLK™ is applied in a manner similar to that for the first layer to produce layer 9 (FIG. 2). Porous SiLK™ is applied to the wafer and the wafer is spun at 3000 rpm for 30 seconds. The wafer is placed on a 250° C. hot plate for 2 minute to partially dry the solvent. At this point the wafer is placed in an oxygen controlled oven and cured at 415° C. for 90 minutes to cure the SiLK and etch stop layers, to promote crosslinking between the layers and to thermally degrade and burn out the porogen.

C. Additional Dielectric Layers Added for Dual Damascene Patterning (Distributed Hard Mask)

The cured wafer containing the layers described above was placed in a PE CVD reactor and a 350 Å layer of silicon nitride 11 was deposited at 350° C., followed by the deposition of a 1500 Å layer 12 of $SiO_2$ at 350° C.

D. Lithography and Etching Steps are Performed

Lithography and etching processes are then performed as described in the above referenced U.S. Pat. No. 6,537,908 B2.

E. A Thin Non-Porous Layer Applied to Planarize the Line (Trench) Sidewalls

The thin non-porous layer of low k dielectric SiLK™ (diluted with solvent to achieve a film thickness of 50-100 Å at 2500 rpm) is applied to the substrate by spin coating (layer 15, FIG. 2). After spinning, the wafer is placed on a 310° C. hot plate for 2 minutes. The film is then cured in a furnace or hot plate at a time sufficient to cure the SiLK film (415 C for 60 minutes). After cure a short Reactive Ion Etch Step is applied to remove the thin SilK layer a the bottom of the Via. With this step the dielectric layer is also removed from the bottom of the line and remains only on the sidewalls of the line and via.

F. The dual damascene structure is then completed using standard process methods known in the industry (the etched trench and via profiles are filled with a liner and then with copper and the copper is planarized by CMP).

During the final CMP process, silicon dioxide layer deposited in step C is removed, leaving the structure shown in FIG. 2. It should be noted that the dielectric layers (5, 7 and 9) shown in FIG. 2 have been cured in a single furnace cure step after sequential application of the 3 layers in a single spin/apply tool.

Incorporating a non-porous dielectric layer below the etch stop and the porous dielectric layer allows for smoother lines by eliminating pores at the bottom of the etch stop. Specifically, in a dual damascene process, the last step of the RIE process that includes the cap open step, can result in the line bottoms etching through the etch stop and landing on the top of the dielectric that is directly below the etch stop. Incorporation of the dense dielectric at the via level porous dielectric and the etch stop will result in decreased line roughness compared with the conventional structure that has the porous dielectric directly below the etch stop.

While we have shown and described several embodiments in accordance with our invention, it is to be clearly understood that same are susceptible to numerous changes that would be apparent to one skilled in the art. Therefore, we do not wish to be limited to only what is shown or described but contemplate all changes and modifications that are within the scope of the appended claims.

What is claimed is:

1. A microprocessor comprising:
   electrical interconnections having an RC delay comprising ultra low dielectric constant materials providing a circuit speed, said electrical interconnections comprise;
   a dual damascene interconnect structure, comprising:
   a patterned multilayer of dielectrics on a substrate, comprising: a cap layer;
   a first non-porous via level low-k dielectric layer having thereon metal via conductors with a bottom portion and sidewalls;
   an etch stop layer;
   a first porous line level low-k dielectric layer having thereon metal line conductors with a bottom portion and sidewalls;
   a polish stop layer over said first porous low-k dielectric;
   a second thin non-porous via level low-k dielectric layer for coating and planarizing the line and via sidewalls; and
   a liner material between said metal via and line conductors and said first non-porous via level low-k dielectric layer, said first porous line level low-k dielectric layer, and said second thin non-porous via level low-k dielectric layer,
   wherein said second thin non-porous via level low-k dielectric layer has a composition that is covalently bonded with said first non-porous via level low-k dielectric layer, said first porous line level low-k dielectric layer, and said etch stop layer.

2. The microprocessor of claim 1, wherein said first porous line level low-k dielectric layer and said first non-porous via level low-k dielectric layers form covalent bonds with said etch stop layer.

3. The microprocessor of claim 1, wherein said first non-porous via level low-k dielectric layer has a material that is covalently bound to said etch stop layer.

4. The microprocessor of claim 3, wherein said covalently bound material is selected from the group consisting of non-porous low k dielectric materials, organic material and any combinations thereof.

5. The microprocessor of claim 1, wherein said first porous line level low-k dielectric layer has a material that is covalently bound to said etch stop layer.

6. The microprocessor of claim 1, wherein said first porous line level low-k dielectric layer has a material that is a porous organic material.

7. The microprocessor of claim 1, wherein said first porous line level low-k dielectric material has pores with a pore size greater than 2 nm.

8. The microprocessor of claim 1, wherein said first non-porous via level low-k dielectric and said first porous line level low-k dielectric layers have identical chemical compositions.

9. The microprocessor of claim 1, wherein said first non-porous via level low-k dielectric layer, said first porous line level low-k dielectric and said second thin non-porous via level low-k dielectric layers are organic.

10. The microprocessor of claim 1, wherein said etch stop layer and said second thin non-porous via level low-k dielectric layers contain silicon.

11. The microprocessor of claim 1, wherein said etch stop layer contains silicon.

12. The microprocessor of claim 1, wherein said second thin non-porous via level low-k dielectric layer and said first non-porous via level low-k dielectric layer have identical compositions.

13. The microprocessor of claim 1, wherein said second thin non-porous via level low-k dielectric layer has the same chemical composition as said etch stop layer.

14. The microprocessor of claim 1, wherein said second thin non-porous via level low-k dielectric layer has a thickness of about 20 Å to about 100 Å.

15. The microprocessor of claim 1, wherein said second thin non-porous low-k dielectric layer is selected from the group consisting of organo silsesquioxanes, hydrido silsesquioxanes, hydrido-organo silsesquioxanes, siloxanes, silicon carbides, silicon oxides, and any combinations thereof.

16. The microprocessor of claim 1, wherein said second thin non-porous via level low-k dielectric layer conformally coats the line and via sidewalls.

17. The microprocessor of claim 1, wherein said first porous line level low-k dielectric layer has a thickness of about 600 Å to about 5000 Å.

18. The microprocessor of claim 1, wherein said etch stop layer has a chemical composition comprising silicon, carbon, oxygen and hydrogen.

19. The microprocessor of claim 1, wherein said etch stop layer is comprised of a spin-on material with etch selectivity to said first porous line level low-k dielectric.

20. The microprocessor of claim 1, wherein said etch stop layer is selected from the group consisting of organo silsesquioxanes, hydrido silsesquioxanes, hydridoorgano silsesquioxanes, siloxanes, silicon carbides, silicon oxides and any combinations thereof.

21. The microprocessor of claim 1, wherein said etch stop layer has a thickness of about 50 Å to about 600 Å.

22. The microprocessor of claim 1, wherein said liner material comprises one or more metals selected from the group consisting of: Ti, TiN, Ta, TaN, W, TiW, TaSiN, WN, nitrides thereof and any combinations thereof.

23. The microprocessor of claim 1, wherein said liner material is a material deposited by sputter deposition, physical vapor deposition (PVD), chemical vapor deposition (CVD), ionized physical vapor deposition (Ionized PVD), atomic layer deposition (ALD) and any combinations thereof.

24. The microprocessor of claim 1, wherein said liner material is continuous and does not penetrate into said first porous line level low-k dielectric layer.

25. The microprocessor of claim 1, wherein said second thin non-porous via level low-k dielectric layer is arranged substantially perpendicular to said first non-porous via level low-k dielectric layer, said first porous line level low-k dielectric layer, and said etch stop layer.

\* \* \* \* \*